United States Patent
Biagi

(10) Patent No.: US 7,551,413 B2
(45) Date of Patent: Jun. 23, 2009

(54) TRANSIENT TRIGGERED PROTECTION OF IC COMPONENTS

(75) Inventor: Hubert John Biagi, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 212 days.

(21) Appl. No.: 11/212,256

(22) Filed: Aug. 26, 2005

(65) Prior Publication Data

US 2007/0047164 A1 Mar. 1, 2007

(51) Int. Cl.
*H02H 9/00* (2006.01)
(52) U.S. Cl. .......................... 361/56; 361/111
(58) Field of Classification Search .................. 361/56, 361/111
See application file for complete search history.

(56) References Cited

U.S. PATENT DOCUMENTS 5,937,622 A * 8/1999 Carrier et al. ................ 56/11.9
6,107,784 A * 8/2000 Nomiya et al. ............... 323/205
6,137,338 A * 10/2000 Marum et al. ................ 327/318
6,311,049 B1 * 10/2001 Yoshizawa ................ 455/250.1
6,614,806 B1 * 9/2003 Nanni .......................... 370/468
6,912,381 B2 * 6/2005 Murtojarvi .................. 455/296

* cited by examiner

*Primary Examiner*—Stephen W Jackson
(74) *Attorney, Agent, or Firm*—John J. Patti; Wade J. Brady, III; Frederick J. Telecky, Jr.

(57) ABSTRACT

One embodiment provides a system for protecting at least one component in an integrated circuit (IC). The system includes a disconnect element that is electrically connected in series between an input terminal of the IC and the at least one component. The disconnect element is configured to have a first state to electrically connect the terminal to the at least one component and a second state corresponding to a high impedance condition that electrically isolates the terminal relative to the at least one component. A control system is configured to cause the disconnect element to transition from the first state to the second state in response to a rate of change of an input signal at the terminal exceeding a predetermined rate of change.

21 Claims, 3 Drawing Sheets

US 7,551,413 B2

TRANSIENT TRIGGERED PROTECTION OF IC COMPONENTS

TECHNICAL FIELD

This invention relates to electronic circuits, and more specifically to a system that provides transient triggered protection of integrated circuit components.

BACKGROUND

Integrated circuits (ICs) are widely used in many applications. ICs can include a variety of circuitry that can operate as stand alone systems or in conjunction with other circuit components. ICs include an arrangement of pins that provide means for receiving power as well as for communicating information relative to the IC. As a result, ICs are vulnerable to external environmental conditions through such pins. For example, ICs can be damaged by electrostatic discharge (ESD) events, in which large currents flow through the IC usually initiated at one or more pins.

The vulnerability of IC chips to ESD and other events has created need for ESD protection circuits. Consequently, ESD protection circuits are often added to the integral design of IC chips. Many conventional ESD protection schemes for ICs employ peripheral dedicated circuits to carry the ESD currents from the pin or pad of the device to ground by providing a low impedance path. In this way, the ESD currents flow through the ESD protection circuitry, rather than through the more vulnerable circuits in the chip.

FIG. 1 depicts an example of part of an IC 2 that includes an electrically erasable programmable read-only memory (EEPROM) 4. The EEPROM 4 can be programmed by providing an enable input signal at a pin (ENB) 6. The pin 6 also can provide an enable signal to other circuitry, such as to enable internal logic. One or more ESD protection circuits 8 can be associated with the pin 6. For example, a first ESD protection circuit can be connected directly at the pin 6. Another ESD protection circuit 8 can be connected to the signal path between a resistor R and the EEPROM 4. The ESD protection circuit 8, for example, can include a fast switch or clamp and RC filter that are activated as a function of the signal at the pin 6 to shunt current away from the EEPROM 4 during an ESD event. The ESD protection circuit 8 can divert current from the input and discharge the current through the ESD protection circuit, thus protecting the EEPROM 4 from damage resulting from the ESD event.

Conventional ESD protection, however, may not be capable of providing adequate protection in all circumstances. For instance, some types of ICs include programmable circuitry, such as electrically programmable read only memory (EPROM), that may require higher voltages be applied at one or more pins to implement certain modes (e.g., programming mode) of operation. Since the higher voltages are applied to the ICs, conventional ESD protection have to be modified to allow operation at the higher voltages and thus may become ineffective in suppressing certain transient events. Accordingly, a spike in the input voltage at an input pin, such as may be due to applying an external voltage or to parasitic conditions, could cause inadvertent re-programming or poor field retention by certain IC chips.

SUMMARY

The present invention relates to electronic circuits, and more particularly to a system and method for protecting circuit components in an integrated circuit (IC) from voltages applied at an input pin. The system operates by electrically disconnecting the pin from the internal components of the IC in response to a transient characteristic (e.g., dv/dt) of a signal applied at the input pin.

One embodiment provides a system for protecting at least one component in an integrated circuit (IC). The system includes a disconnect element that is electrically connected in series between an input terminal of the IC and the at least one component. The disconnect element is configured to have a first state that electrically connects the terminal to the at least one component and a second state that electrically isolates the terminal from to the at least one component. A control system is configured to cause the disconnect element to transition from the first state to the second state in response to a rate of change of an input signal at the terminal exceeding a predetermined rate of change.

Another embodiment provides an integrated circuit (IC) chip that includes a first pin and a disconnect element electrically connected between the first pin and programmable circuitry within the IC. The disconnect element is configured to have a first condition that electrically connects the first pin to the programmable circuitry and a second condition that electrically isolates the first pin relative to the programmable circuitry. A clock signal is provided at the first pin at a first regulated voltage for normal operation of the IC and is provided at a second higher program voltage, which that exceeds the first regulated voltage, for implementing programming the programmable circuitry. A control system is configured to monitor the signal provided at the first pin and to trigger disconnect element to transition from the first state to the second state in response to a rate of change of a signal provided at the first pin that exceeding a predetermined rate of change. The rate of change of the clock signal during the normal operation of the IC and during programming is less (i.e., slower) than the predetermined rate of change to mitigate false triggering of the disconnect element.

DETAILED DESCRIPTION

The present invention relates to electronic circuits, and more particularly to a system for protecting circuit components in an integrated circuit (IC) from voltages applied at one or more pins. The system operates by triggering a disconnect element to electrically disconnect the pin from certain internal components of the IC in response to an input signal at the pin experiencing a rate of change that exceeds (e.g., is significantly faster than) normal operating parameters. The input signal can be provided with the increased or faster rise/fall time to trigger a disconnect element to electrically isolate the pin from the internal components. A control system can be configured to trigger the disconnect element to achieve a permanent electric isolation between the pin and the internal components. The disconnect element can be implemented at a location in the IC that still permits signals (e.g., clock signals) applied at the pin to be supplied to other, less vulnerable circuitry.

Figure 1:
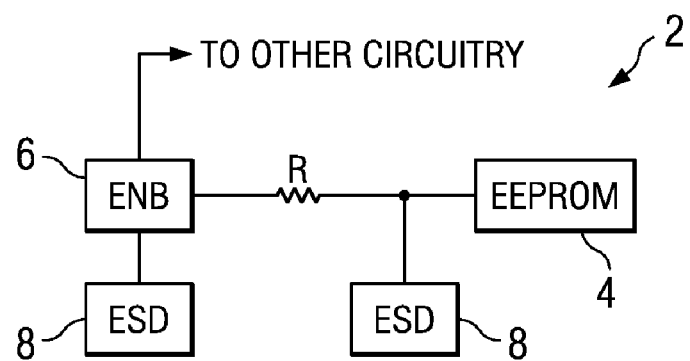
FIG. 1 illustrates an example of part of an IC that contains a prior art ESD detection and protection circuit.
Figure 2:
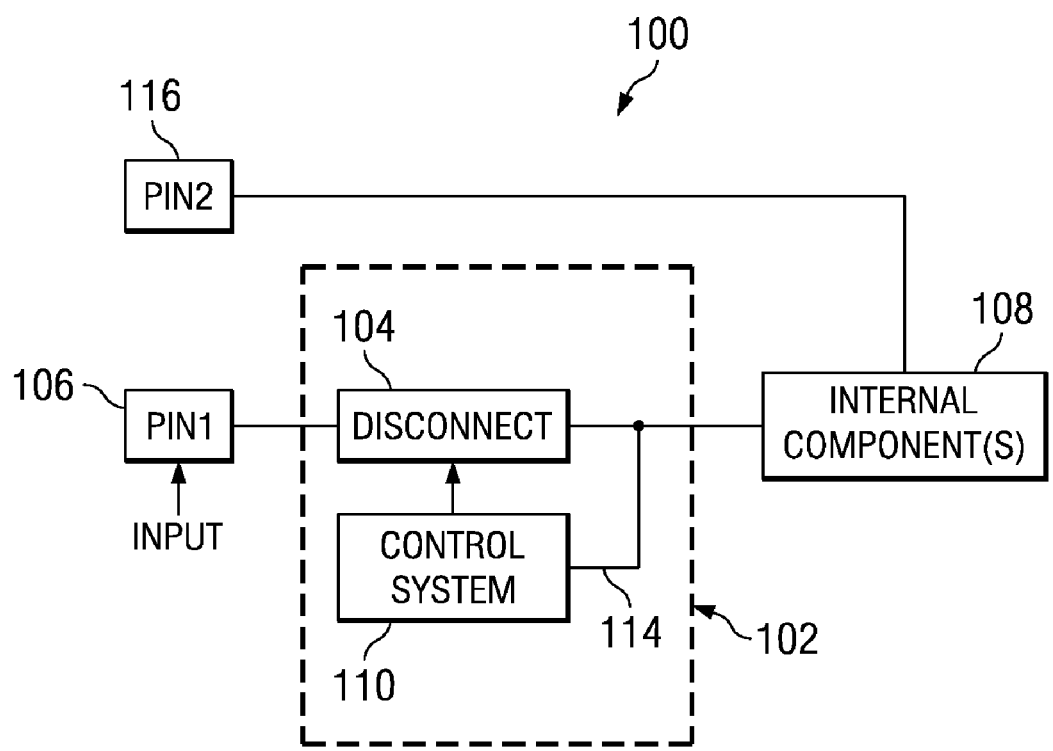
FIG. 2 illustrates an example of a system for protecting circuit components in accordance with an aspect of the invention.

FIG. 2 illustrates an example of part of an IC 100 implementing a protection system 102 in accordance with an aspect of the present invention. The protection system 102 includes a disconnect element 104 connected between a pin 106 and one or more internal components 108. The disconnect element 104 can be implemented as a device configured to permit an electrical signal to propagate unimpeded from the pin 106 to the internal components 108 when in a first state and to provide a substantially galvanic barrier that prevents transmission of the electrical signal when in a second state. By "galvanic barrier" it is meant that the disconnect element 104 provides a physical isolation barrier (e.g., very high impedance, such as on the order of giga ohms) between the pin 106 and the one or more components 108. For example, the disconnect element 104 can be implemented as a transmission gate (tgate) device, a fuse link or other device or combination of devices capable of providing desired isolation between the pin 106 and the internal components 108.

The protection system 102 also includes a control system 110 that is configured trigger the disconnect element 104 to transition from the first state to the second state based on the input signal supplied to the pin 106. The control system 110 can include control logic and drive circuitry configured to activate the disconnect element 104. The control logic can be configured to discern whether a transient characteristic (e.g., rise time or fall time) associated with the input signal at the pin 106 is outside of expected (e.g., normal) operating parameters. The control logic can be further configured to detect whether the INPUT signal is provided at an increased voltage level, for example, at least twice the normal voltage of the INPUT signal. The drive circuitry is configured to trigger the disconnect element to its second, high impedance state in response to the control logic latching an output signal indicating the transient characteristic.

The control system 110 can be configured with associated circuitry that latches in response to detecting the occurrence of the transient condition. When the associated circuitry latches, for example, it triggers the disconnect element 104 to electrically disconnect the pin 106 from the internal components 108. The INPUT signal at the pin 106 and its corresponding electrical characteristic of can be monitored as the voltage at a node between the disconnect element 104 and the one or more circuit components 108, as depicted at 114. The IC 100 can also include one or more other pins 116 that can be utilized for other purposes that are separate from providing the isolation barrier between the pin 106 and the internal components 108. Advantageously, the disconnect element 104 can be triggered based on detecting to the second state without requiring input or additional programming from within the IC.

By way of further example, the internal component 108 can include a programmable memory device (e.g., EEPROM). The pin 106 can correspond to an enable pin to which a corresponding program voltage (e.g., a clock signal) is provided for programming the programmable memory device. The voltage level at the pin 106 can vary during normal operation according to the operating mode of the programmable memory. For instance, during a load mode and preview mode, the voltage at the pin 106 can be provided as a clock signal that alternates between electrical ground and a regulated voltage for the IC 100 (e.g., typically ranging from about 5 V to about 5.5V). The INPUT signal can be provided to the pin 106 at a significantly higher peak voltage (e.g., a program voltage ranging from about 12 V to about 14 V or higher) to program data into the memory while in a program mode. The transient characteristics of the program voltage and the normal clock signal supplied to the pin 106, however, are within a normal operating parameters of the IC 100, such that the disconnect element 104 is not triggered to the second state.

When it is desirable to disconnect the pin 106 from the internal components 108, such as after the programmable memory device has been successfully programmed, a trigger signal can be provided at the pin 106 as the INPUT signal. The trigger signal can be provided with a transient characteristic that outside normal expected operating parameters. The trigger signal can also be provided at an increased voltage level, such as corresponding to level of the program voltage. As mentioned above, the trigger signal can be applied at the pin 106 with a transient characteristic rise (or fall) time that is significantly faster (e.g., about one or more orders of magnitude faster) than the rise (or fall) time of the INPUT signal during normal operation. The control system 110 thus is configured to latch a logic state and to drive the disconnect element 104 to its high impedance state in response to detecting a sufficient transient condition of the trigger signal, but implements no latching or triggering in response to normal transient conditions of the input signal (e.g., clock signal) during normal operation.

Conventional ESD protection circuitry (not shown) is usually effective in limiting transients at the pin 116, but may not be entirely effective at pin 106 due to the high voltages that are often applied, such as during programming of the internal components 108. Thus, the internal components may 108 become vulnerable to voltage spikes and other transients at the pin 106. The disconnect element 104 thus can be utilized to provide additional protection for the internal components 108, such as after the internal circuitry has been programmed or configured to a desired state. In response to detecting the transient condition at the pin 106, the control system 110 activates the disconnect element 104 to the second high state, which impedance can provide a physical isolation barrier (e.g., a substantially galvanic barrier) between the pin 106 and the internal components 108. The physical isolation barrier can be permanent. The physical isolation effectively mitigates vulnerability of the internal components 108 to spikes or other voltage increases that might subsequently occur at the pin 106.

Figure 3:
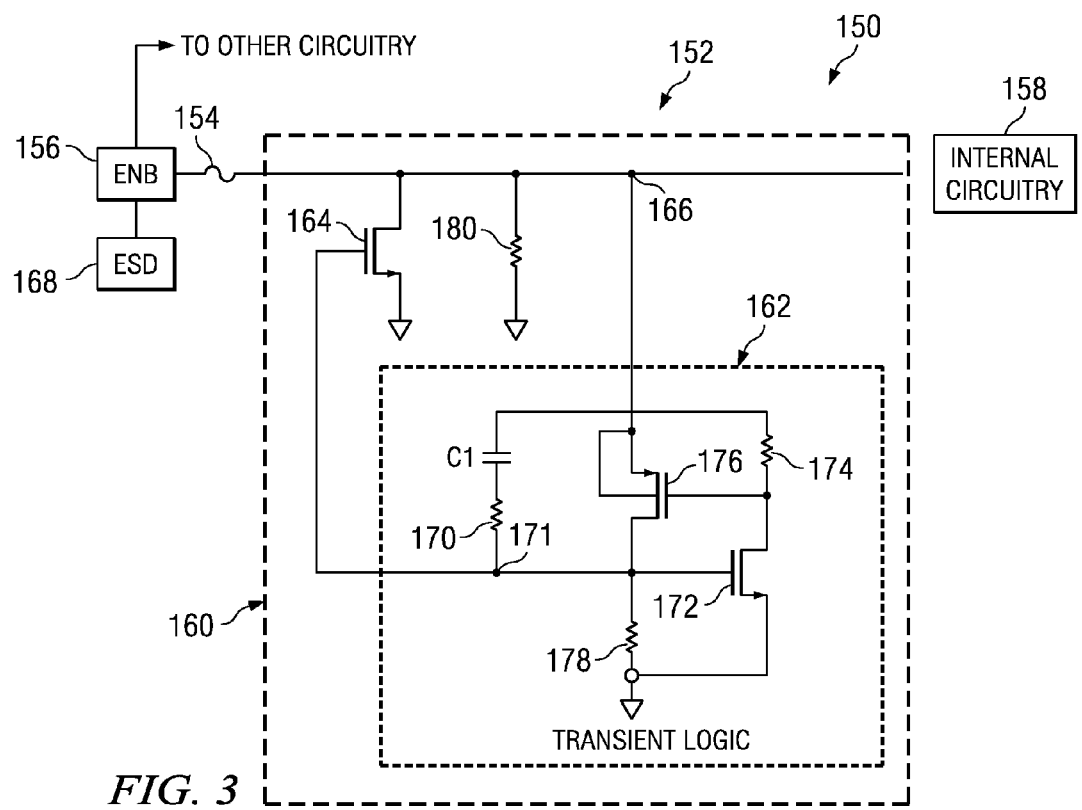
FIG. 3 illustrates another example of a system for protecting circuit components in accordance with an aspect of the invention.

FIG. 3 depicts an example of part of an integrated circuit 150 implementing a protection system 152 that can be implemented in accordance with an aspect of the present invention. The protection system 152 includes a disconnect element, which in the example of FIG. 3 is depicted as a fuse link 154. The fuse link 154 is connected between a pin 156 of the IC 150 and internal circuitry 158. The fuse link 154 has a first state that electrically connects the pin 156 with the internal circuitry and a second state that electrically disconnects the pin from the internal circuitry 158. That is, the fuse link 154 provides a substantially galvanic and permanent solution for disconnecting the input pin 156 from the internal circuitry 158 when in the second state and essentially provides a short circuit (e.g., a low resistance path of about 100 Ohms) between the pin and the internal circuitry when in the first state. Because the fuse link 154 can be activated or blown to provide a permanent physical isolation barrier between the pin 156 and the internal circuitry 158, no ESD protection device is required between the pin 156 and the internal circuitry 158. However, conventional ESD protection may still be provided at the pin 156, as indicated at 168.

The protection system 152 also includes a control system 160 that controls the fuse link 154 based on the voltage at the pin 156. For instance, the control system 160 is configured to blow the fuse link 154 (e.g., transition to the second state) in response to a transient condition at the pin 156 that is outside normal operating parameters of the signal at the pin 156. In the example of FIG. 3, the control system 160 includes a transient logic block 162 coupled to a transistor device 164. For example, the transistor device can be an N-channel metal oxide semiconductor field effect transistor (MOSFET) sized to handle high voltages (e.g., greater than about 10 V). The transistor device 164 is connected between electrical ground and a node 166, which interconnects the fuse link 154 and the internal circuitry 158. The transient logic block 162 is configured to provide a logic output signal to operate the transistor 164 based on detecting the occurrence of the transient condition at the pin 156. The transistor device 164 operates as drive circuitry to blow the fuse link 154 according to the state of the logic output signal.

For example, when the transient logic block 162 detects a trigger condition at the node 166, the logic block provides the logic output signal to drive the gate of the transistor device 164 so as to conduct current from the internal node 166 through the transistor device to electrical ground. By shunting current through the transistor device 164 in this way, sufficient current (e.g., about 100 mA or more) can pulled through the fuse link 154 in a short period of time (e.g., about 5 to about 10 nanoseconds) to blow the fuse link and thereby provide a substantially galvanic barrier between the pin 156 and the internal circuitry 158. Even with the galvanic barrier provided by the fuse link 154, the enable signal provided at the pin 156 may still be provided to other circuitry through other internal circuit connections (not shown). However, potential spikes and other transients at the pin 156 are permanently isolated from the internal circuitry 158.

Turning to the contents of the transient logic block 162, the block includes a capacitor C1 connected in series with a resistor 170 (forming an RC network) between the node 166 and an output node 171 that is connected to the gate of the transistor device 164. The gate of another transistor (e.g., an N-channel MOSFET) device 172 is also connected to the node 171. A second resistor 174 is connected between the drain of the transistor device 172 and the node 166. The RC network is connected in parallel with a P-channel transistor (P-channel MOSFET) device 176 between the nodes 166 and 171. The gate of the transistor device 176 is connected to the drain of the transistor device 172. Another resistor 178 is connected between the gate and source of the transistor device 172.

The capacitor C1 and the resistor 170 are tuned to provide a corresponding delay for turning on the N-channel transistor device 172 based on the voltage at the node 166. In particular, the capacitor C1 is tuned to set the threshold rate of change in the signal at 166 required to establish a corresponding latch condition. The threshold need not be precisely set. As the capacitor C1 charges during a sufficiently fast transient event at the node 166 the N-channel transistor 172 is biased to conduct current, and a corresponding voltage develops across the resistor 174. The voltage across the resistor 174, in turn, activates the P-channel transistor device 176. After the P-channel transistor device 176 turns on, a corresponding voltage drop is established across the resistor 178. The voltage drop across the resistor 178 operates to drive the N-channel transistor device 172 with increased bias. This results in a rapid activation and latching of a high voltage at the node 171, which drives the high voltage transistor device 164 to an on condition. The high voltage transistor device 164 draws sufficient current (e.g., about 100 mA in about 5 nS to 10 nS) through the fuse link 154 to blow the fuse.

When the fuse link 154 has been blown, it provides a permanent and substantially galvanic barrier between the pin 156 and the internal circuitry 158. As mentioned above, the input signal at the pin 156 may still be passed to other less vulnerable circuitry in the IC 150 through other connections (not shown). A resistor 180 can be connected in parallel with the high voltage transistor device 164 between the node 166 and electrical ground. The resistor 180 provides a path for discharging the transient logic block 162 and pulling the node 166 to electrical ground after the fuse link 154 has been blown.

Figure 4:
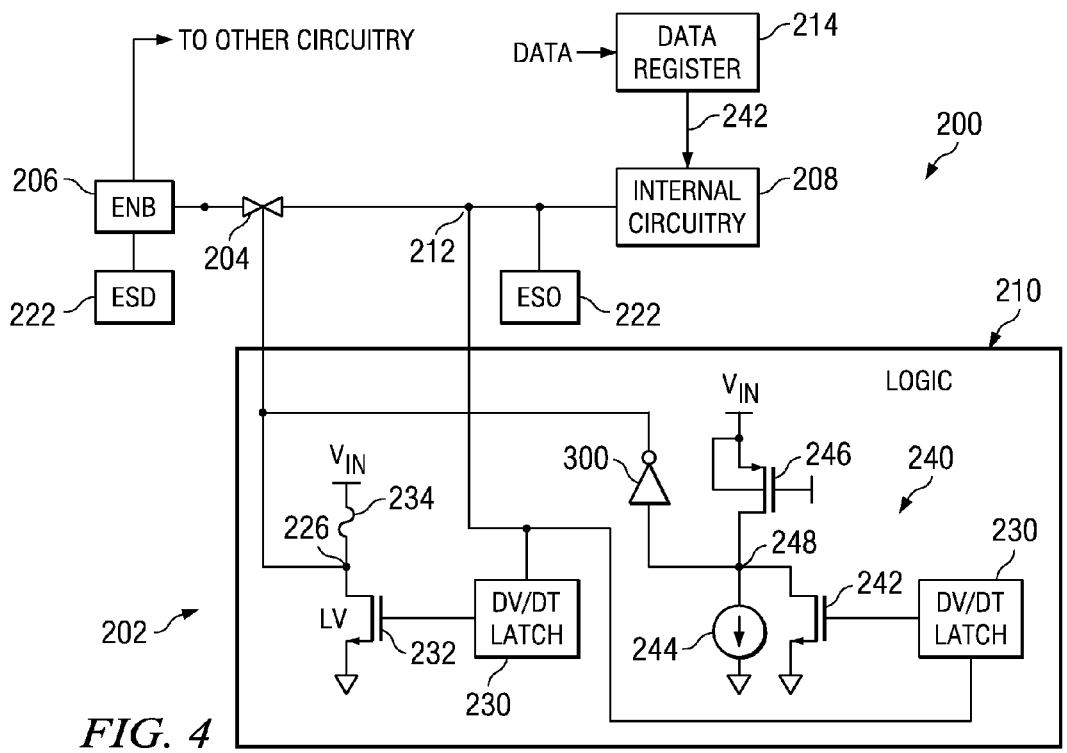
FIG. 4 illustrates yet another example of a system for protecting circuit components in accordance with an aspect of the invention.

FIG. 4 depicts an example of part of an integrated circuit 200 implementing protection system 202 according to an aspect of the present invention. In the example of FIG. 4, the protection system 202 is illustrated as including a transmission gate (tgate) 204 connected between an input pin 206 and internal circuitry 208. It is to be understood that the approach shown in FIG. 4 is not limited to use with a tgate type of disconnect element, as other types of devices can be employed to disconnect the pin 206 from the internal circuitry 208, such as other types of switches, fusable links and the like. As an example, a transmission gate consists of N-Type and one P-Type transistor connected in parallel and controlled by inverted gate voltages. The tgate 204 can operate in a first (e.g., ON) state that freely passes the enable input signal from the pin 206 to the internal circuitry 208 and a second (e.g., OFF) state that provides a very high impedance sufficient to block the enable input signal from being transmitted through the tgate to the internal circuitry 208.

As an example, the internal circuitry 208 can be programmable circuitry, such as an EEPROM. A data register 214 can be programmed with instructions for the EEPROM, such as according to DATA entered at a data pin (not shown) of the IC 200. For instance, the data register 214 can store both program data as well as control bits that indicate an operating mode for the EEPROM. Corresponding data from the data register can be programmed into the EEPROM in response to entering a program mode concurrently with a program voltage being applied at the pin 206. The input signal is provided at the pin 206 at the lower regulated voltage during normal operating mode, and at a higher programming voltage for programming the data into the EEPROM. In contrast, the DATA signal (e.g., from a data pin) is provided at or below the regulated voltage. For example, the data provided at the data pin can be clocked into the data register 214 as a function and at a rate according to the signal provided at the pin 206.

ESD protection circuitry 222 can be utilized at the pin 206 as well as internally to mitigate harm due to ESD events. Due to the requirement that the ESD protection circuitry 222 should permit higher voltages at the pin 206 to allow programming of the internal circuitry 208, such as EEPROM, the internal circuitry may become vulnerable to voltage spikes at the pin 206 in the absence of the protection system 202. Such spikes, under certain circumstances may result in inadvertent programming of the EEPROM.

Accordingly, the protection system 202 includes a control system 210 configured to turn off or deactivate the tgate 204 in response to detecting an activation condition, such as a predetermined transient event at the pin 206. That is, the control system 210 can include logic configured to detect an activation condition based on the rate of change of the signal at an internal node 212, corresponding to the signal at the pin 206, exceeding (i.e., being faster than) a predetermined rate of change. The control system 210 also includes circuitry configured to turn off the tgate 204, which can be permanently or programmable based upon the control circuitry implemented therein. The control system 210 can be implemented with one or more control circuits.

In the example of FIG. 4, a first control circuit 226 includes a dv/dt logic latch 230 that detects the activation condition based on the voltage of the signal at the pin 206. For example, the dv/dt logic latch 230 can include circuitry (e.g., see FIG. 3) that is configured to activate a latch if the input signal at 206 has at least a predetermined voltage with a predetermined transient (e.g., dv/dt) characteristic. As mentioned herein, the predetermined transient characteristic does not have to be set precisely. For example, the circuitry can be configured such that the transient trigger requires a much faster (e.g., approximately one or more orders of magnitude greater) than the normal signals provided at the pin 206. For example, a normal input signal at the pin 206 can have a rise time of about 100 µs, whereas the circuitry of the dv/dt latch may required 1 µs or faster trigger signal at the pin 206 to implement the latch condition. If the voltage at 206 exceeds the predetermined threshold voltage with at least predetermined transient characteristic, the dv/dt latch latches a corresponding output signal.

As used herein and in the appended claims, the phrase "exceeding a predetermined threshold" and variants thereof is meant to include both being greater than a positive threshold and being less than a negative threshold. The appropriate relationship between the threshold voltage and the voltage at the pin 206 can be established according to the configuration of the protection system 202 and the voltage levels within the IC 200. It is further to be appreciated that the protection system can be configured to trigger the disconnect element 204 if the voltage at the pin 206 either is greater than a positive threshold or is less than a negative threshold.

The dv/dt logic latch 230 is coupled to drive a transistor device 232 in response to detecting the trigger condition. The transistor device 232 is connected in series with a fuse link 234 between a regulated voltage, indicated a $V_{IN}$, and electrical ground. Thus, when the logic latch 230 provides the output signal to drive the transistor 232 to conduct current, the fuse link 234 is blown. When the fuse link 234 is blown, the control input of the tgate 204 is pulled low through the transistor 232 so as to turn off the tgate. Because blowing the fuse link 234 provides a permanent and substantially galvanic barrier between $V_{IN}$ and the transistor device 232, the state of the tgate also is permanent. Those skilled in the art will understand and appreciate that other implementations and configurations that could be used for the tgate 154, which might require different voltage levels to turn off the tgate. Other permanent solutions can also be used in place of the indirect application of the fuse link 234.

The other control circuitry 240 corresponds to a one-time programmable network. The control circuitry 240 includes a logic latch 230 that is operative to detect the activation condition. For purposes of simplicity of explanation, the logic latch 230 is identified by the same reference number as the logic latch in the control circuitry 226. It will be understood and appreciated that the logic latches 230 can be the same or it can be different then the logic latch of the control circuitry 226. The logic latch 230 drives a transistor device 242 that is connected in parallel with a current source 244 between a node 248 and electrical ground. The current source 244 can be a weak current source (e.g., about 1 nA) implemented using appropriately configured and sized transistor devices. A floating gate transistor device (e.g., a floating gate PMOS device) 246 is connected between a regulated voltage ($V_{IN}$) and the node 248. In response to the control input 212 indicating the activation mode and the voltage at the pin 206 exceeding a predetermined high-voltage threshold (e.g., greater than about 12-14 V), the logic latch 230 turns on the transistor device 242. When the transistor device 242 is activated, the gate of the floating gate P-channel device 246 charges and, in turn, activates the P-channel device to supply current (the P-channel device being stronger than the current source 244), such that the node 248 is pulled high through the floating gate P-channel. The signal at 248 can be inverted through an inverter 300 (assuming a logic low is required to turn off the tgate) and provided as a corresponding control signal to turn off the tgate 204.

While the control system 210 of FIG. 4 has been described in the context of controlling the tgate 204, it will be understood and appreciated that each of the control circuitry 226 and 240 are equally applicable as controls for other types of protection systems implemented according to an aspect of the present invention. Each of the control circuitry 226 and 240 can be utilized individually or in combination as part of a control system for implementing a protection system according to an aspect of the present invention. Alternatively, both types of control systems can be utilized to enable selection of either a permanent deactivation of the tgate 204 or programmable type of connection through the one time programmable device 240 to disconnect the pin 206 from the internal circuitry 208.

Figure 5:
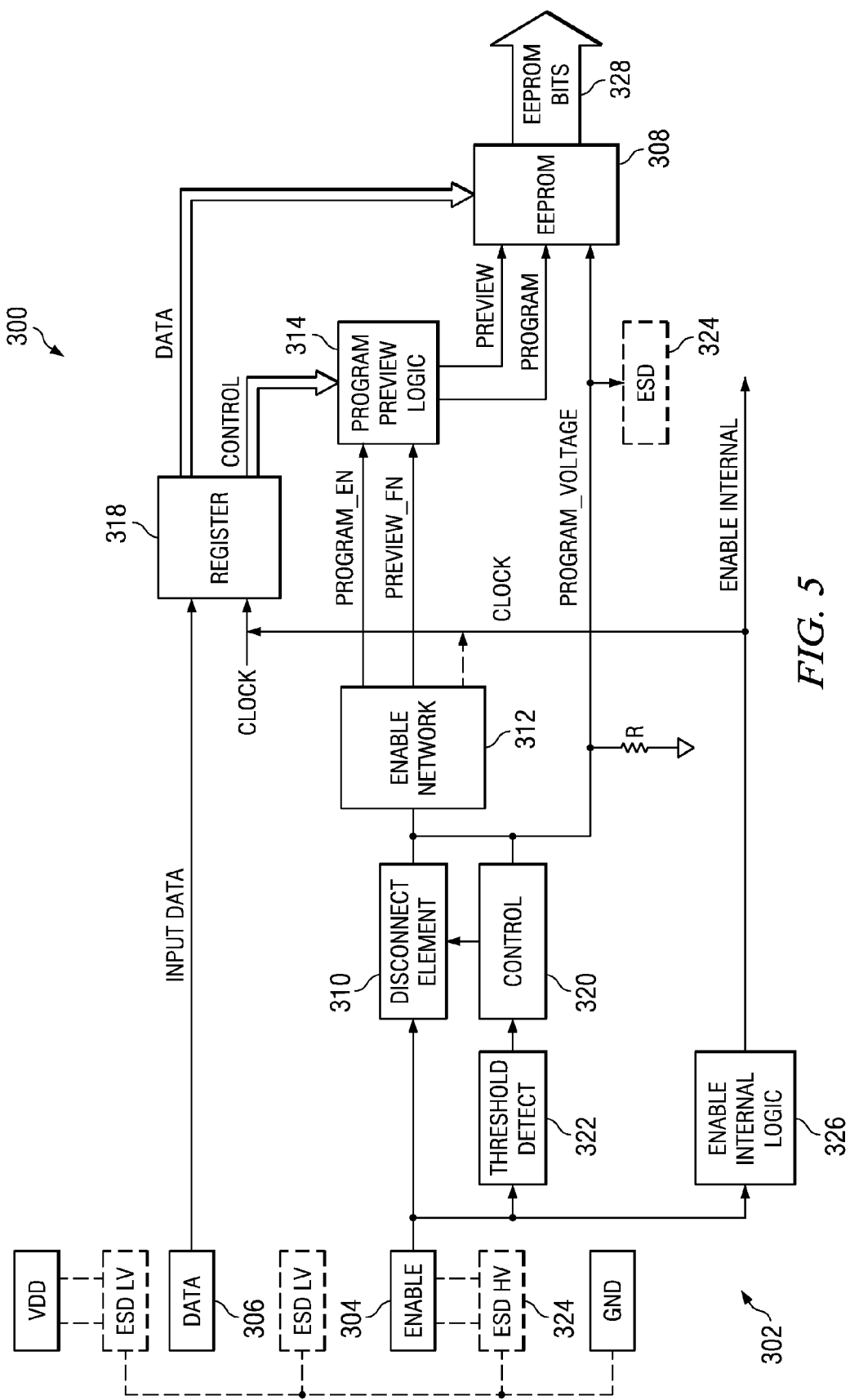
FIG. 5 illustrates part of an integrated circuit implementing a protection system in accordance with an aspect of the invention.

FIG. 5 depicts an example of another type of integrated circuit 300 that can include a protection system 302 in accordance with an aspect of the present invention. The example of FIG. 5 is provided in the context of a pair of pins 304 and 306 of the IC 300 that are utilized in connection with programming an EEPROM 308. Thus, the circuit of FIG. 5 depicts additional circuitry associated with implementing the programming and testing of the EEPROM as well as associated circuitry for the protection system 302.

In FIG. 5, the protection system 302 includes a disconnect element 310 that is connected between the enable pin 304 and the EEPROM 308. For example, the disconnect element 310, can be fuse link, a tgate, or other device capable of being triggered from a conductive to a non-conductive, high impedance state. The disconnect element 310 is configured, during normal operation, to provide an enable (e.g., clock) signal provided at 304 to the EEPROM as well as to an associated enable network 312. The enable network 312 is configured to provide enable signals to associated program and preview logic 314. For example, the enable network 312 can provide a preview enable (PREVIEW_EN) signal to the logic 314 when the program voltage provided at the enable pin 304 is at a first level, such as corresponding to a regulated voltage level ($V_{DD}$). $V_{DD}$ can be generated internally within the IC 300 or it can be provided by external circuitry to the IC via another pin. Additionally, the enable network 312 can provide a program enable (PROGRAM_EN) signal 314 when the signal provided at the pin 304 has a higher programming voltage. The enable network 312 can also help provide an internal CLOCK signal to associated circuitry of the IC 300.

INPUT DATA can be entered at the data pin 306 for programming the EEPROM 308, including program data and mode control data. A register 318 stores the data entered at the data pin 306. The register 318 can be implemented as a multi-bit shift register that provides a multi-bit output, including DATA and CONTROL bits. The DATA bits are provided as a multi-bit output to the EEPROM 308 and contains values (e.g., trim values) that can be programmed into the EEPROM 308. The CONTROL bits of the register 318 can be provided to the program preview logic 314 for controlling the corresponding mode of the EEPROM. For example, the CONTROL bits can correspond to a multi-bit word, such as with different bits being assigned for operating in different modes (e.g., a load mode, a program mode, and a preview mode). The program preview logic 314 in turn provides PROGRAM and PREVIEW control signals to the EEPROM 308. Thus, the EEPROM 308 can be programmed with the DATA when the CONTROL bits provided by the register 318 and the PROGRAM_EN signal have certain predetermined values while a program voltage is provided at the pin 304. Similarly, when the CONTROL bits and the PREVIEW_EN signal have other predetermined values the program preview logic 314 can activate a preview of the data that is to be written to the EEPROM 308

A control system 320 is configured for controlling the disconnect element 310. The control system 320 includes logic and drive circuitry that cooperate to control the disconnect element 310 in response to transient characteristics (e.g., dv/dt) of the signal at the enable pin 304. In the example of FIG. 5, the control system 320 monitors the voltage at the pin 304 to the EEPROM 308 at through a connection to node between the disconnect element and the EEPROM. An additional logic input can be provided by a threshold detection circuit 322. The threshold detection circuit 322, for example, monitors the voltage provided at the enable pin 304 and provides a corresponding logic output based on a comparison of the pin voltage relative to a predetermined programming threshold (e.g., at a logic HIGH when the programming threshold voltage has been reached or exceeded). Those skilled in the art will understand and appreciate various types of comparator circuits and various threshold levels that can be utilized by the threshold detection circuit 322 for providing a corresponding output to the control system 320. For example, the threshold circuit can be employed to enable the control system 320 for transient detection when the voltage at the pin is at least at the program voltage required for programming the EEPROM 308.

The control system 320 provides a control signal to trigger the disconnect element 310 when the signal from the threshold detection circuit 322 indicates that the programming voltage at the pin 304 exceeds a predetermined which is substantially above the regulated voltage and when the signal provided at the enable pin has at least predetermined transient characteristics (e.g., a rise time that is several orders of magnitude faster than the expected clock signal). The control system 320 can be configured to activate the disconnect element 310 to a non-conductive state permanently or, alternatively, the control system can be programmable, such that the disconnect element may re-connect the enable pin 304 with the EEPROM 308. Additionally, an ESD protection device 324 can be provided at the enable pin and/or at program input to the EEPROM 308 between the disconnect element 310 and the EEPROM for providing corresponding ESD protection, such as is known in the art. The need for ESD protection may depend on the type of disconnect element 310 being implemented in the system 300.

The IC 300 can also include an enable internal logic block 326 that can provide a corresponding clock signal for enabling other internal components of the IC 300. For example, the enable internal logic 326 can be circuitry configured to provide a clock signal at or below a corresponding regulated level ($V_{DD}$) regardless of whether the voltage level of the signal provided at the enable pin 304 at the regulated level or at a higher programming voltage.

By way of further example, data may be provided as a serial stream of data to the data pin 306 that is clocked into the register 318 based on the clock signal provided at the enable pin 304. After an appropriate stream of data has been loaded into the register 318, the data can be verified, such as by entering the preview mode via the CONTROL bits and observing the data (e.g., with a programming tool). If the data that has been entered into the shift register is verified during the preview mode, appropriate CONTROL bits can be entered into the shift register 318 for entering the corresponding program mode. For instance, a program voltage signal (e.g., greater than about 12-14 V) can be provided to the enable pin 304 in conjunction with shifting in the program control bits to the shift register such that the data output of the shift register is utilized to program corresponding bits of the EEPROM. However, since the normal program voltage does not have transient characteristics sufficient to set a latch condition for the control system 310, the control system would not trigger the disconnect element 310. After the programming has been completed, an external trigger signal having sufficient voltage and appropriate transient characteristics can be provided at the enable pin 304 such that the activation condition exists and the control system 320 triggers the disconnect element 310 to electrically disconnect the pin from the EEPROM 308. For example, the trigger signal can be provided by a signal generation or other circuitry configured to provide the trigger signal with suitable transient characteristics to latch a control output signal for transitioning the disconnect element to a non-conductive high impedance state. After the EEPROM 308 has been programmed, corresponding output EEPROM data bits 328 can be provided to other circuitry in the IC, such as for trimming parameters of the IC 300.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A system for protecting at least one component in an integrated circuit (IC), the system comprising:
a disconnect element electrically connected in series between an input terminal of the IC and the at least one component, the disconnect element being configured to have a first state to electrically connect the terminal to the at least one component and a second state to electrically isolate the terminal relative to the at least one component; and
a control system configured to cause the disconnect element to transition from the first state to the second state in response to a rate of change of an input signal at the terminal exceeding a predetermined rate of change.

2. The system of claim 1, wherein the control system further comprises logic circuitry coupled to a node between the disconnect element and the at least one component, the logic circuitry configured to latch an output signal at a level for triggering the disconnect element to transition to the second state in response to a rate of change in the voltage at the node exceeding the predetermined rate of change.

3. The system of claim 2, wherein the logic circuitry comprises a capacitor coupled to the node, the capacitor being configured with a capacitance that sets the predetermined rate of change sufficient to enable the logic circuitry to latch the output signal at the output in response to the rate of change in the voltage at the node exceeding the predetermined rate of change.

4. The system of claim 2, wherein the node is an input node of the logic circuitry and the logic circuitry further comprises:

a resistor-capacitor network connected between the input node and an output of the logic circuitry;

a first transistor coupled in parallel with the resistor-capacitor network between the input node and the output of the logic circuitry;

a second transistor connected between a control input of the first transistor and a voltage rail, a control input of the second transistor connected to the output;

a second resistor connected between the input node and the control input of the first transistor; and a third resistor connected between the output and the voltage rail.

5. The system of claim 4, wherein the control system further comprises drive circuitry connected between the output of the logic circuitry and the disconnect element, the drive circuitry being configured to trigger the disconnect element to transition from the first state to the second state based on the output signal provided at the output of the logic circuitry.

6. The system of claim 5, wherein the disconnect element comprises one of a fuse link and a transmission gate.

7. The system of claim 2, wherein the control system further comprises drive circuitry connected between an output of the logic circuitry and the disconnect element, the drive circuitry being triggered to drive the disconnect element to the second state according to the output signal that is provided at the output.

8. The system of claim 1, wherein the at least one component comprises a programmable memory device and the terminal corresponds to a first pin of the IC, the input signal to whose rate of change the system is responsive being provided at the first pin during normal operation with a transient characteristic that is less than the predetermined rate of change.

9. The system of claim 8, the programmable memory device comprises an electrically erasable programmable read-only memory (EEPROM) device, the EEPROM device being programmable with data that is supplied to a second pin at or below a regulated voltage of the IC while an elevated program voltage is supplied to the first pin that exceeds the regulated voltage of the IC but with the transient characteristic that is less than the predetermined rate of change.

10. The system of claim 1, wherein the disconnect element comprises a transmission gate, the control system turning off the transmission gate in response to the rate of change of the input signal at the terminal exceeding the predetermined rate of change.

11. The system of claim 1, wherein the disconnect element comprises a fuse link, the control system supplying current to activate the fuse link in response to detecting the rate of change of the input signal at the terminal exceeding the predetermined rate of change such that the high impedance condition is permanent.

12. The system of claim 1, further comprising a threshold detector providing an output signal having a state that varies based on comparison of a voltage at the terminal relative to a predetermined threshold, the control system causing the disconnect element to transition to the second state based on the output signal from the threshold detector and in response to the rate of change of the input signal at the terminal exceeding the predetermined rate of change.

13. An integrated circuit (IC) chip comprising:
a first pin;
a disconnect element electrically connected between the first pin and programmable circuitry within the IC, the disconnect element being configured to have a first state that electrically connects the first pin to the programmable circuitry and a second state that electrically isolates the first pin relative to the programmable circuitry, a clock signal being provided at the first pin at a first regulated voltage for normal operation of the IC and being provided at a second higher program voltage, that exceeds the first regulated voltage, for implementing programming of the programmable circuitry; and a control system configured to monitor the clock signal provided at the first pin and to trigger the disconnect element to transition from the first state to the second state in response to detecting a rate of change of a signal provided at the first pin that exceeds a predetermined rate of change, the rate of change of the clock signal during the normal operation of the IC and during programming being less than the predetermined rate of change.

14. The IC chip of claim 13, wherein the programmable circuitry further comprises at least one electrically erasable programmable read-only memory (EEPROM) device.

15. The IC chip of claim 14, further comprising a second pin, that is connected to provide a data signal for use by the programmable circuitry, the data signal being normally provided at or below the first regulated voltage.

16. The IC chip of claim 14, wherein the disconnect element comprises a transmission gate, the control system turning off the transmission gate permanently in response to the rate of change of the signal provided at the first pin exceeding the predetermined rate of change.

17. The IC chip of claim 14, wherein the disconnect element comprises a fuse link, the control system supplying current to blow the fuse link in response to the rate of change of the signal provided at the first pin exceeding the predetermined rate of change.

18. The IC chip of claim 14, wherein the control system further comprises:
logic configured to provide a logic signal in response to the rate of change of the signal provided at the first pin exceeding the predetermined rate of change; and
control circuitry coupled to the disconnect element and configured to trigger the disconnect element to transition to the second state in response to the logic signal indicating that the rate of change of the signal provided at the first pin exceeds the predetermined rate of change.

19. The IC chip of claim 18, wherein the control circuitry further comprises a fuse link that is triggered in response to the logic signal indicating that the rate of change of the signal provided at the first pin exceeds the predetermined rate of change, such that the disconnect element remains permanently in the second state.

20. A system for protecting programmable circuitry in an integrated circuit, the system comprising:
means for electrically disconnecting the programmable circuitry from an input pin circuitry, the means for electrically disconnecting having a first state for electrically connecting the first pin to the programmable circuitry and a second state for electrically disconnecting the first pin from the programmable circuitry, a first signal being provided normally to the first pin at or below one of a regulated voltage for the IC and a program voltage for the programmable circuitry that exceeds the regulated voltage; and
means for controlling the means for electrically disconnecting to transition permanently from the first state to the second state in response to a transient characteristic of the signal at the input pin exceeding a predetermined rate of change.

21. A system for protecting at least one component in an integrated circuit (IC), the system comprising:

a disconnect element electrically connected in series between an input terminal of the IC and the at least one component, the disconnect element being configured to have a first state to electrically connect the terminal to the at least one component and a second state to electrically isolate the terminal relative to the at least one component; and a control system configured to cause the disconnect element to transition from the first state to the second state in response to a voltage level of an input signal at the terminal exceeding a predetermined level.

* * * * *